United States Patent [19]
Saltykov

[11] Patent Number: 6,049,618
[45] Date of Patent: Apr. 11, 2000

[54] HEARING AID HAVING INPUT AGC AND OUTPUT AGC

[75] Inventor: Oleg Saltykov, Fairlawn, N.J.

[73] Assignee: Siemens Hearing Instruments, Inc., Piscataway, N.J.

[21] Appl. No.: 08/885,314

[22] Filed: Jun. 30, 1997

[51] Int. Cl.[7] .................................................. H04R 25/00
[52] U.S. Cl. ......................... 381/321; 381/312; 381/121
[58] Field of Search .................................... 381/312, 317, 381/318, 320, 321, 28, 56, 57, 60, 102, 104, 106–109, 120, 121

[56] References Cited

U.S. PATENT DOCUMENTS

| | | | |
|---|---|---|---|
| 4,630,302 | 12/1986 | Kryter | 381/57 |
| 4,952,867 | 8/1990 | Anderson et al. | 323/273 |
| 5,144,675 | 9/1992 | Killion et al. | 381/312 |
| 5,165,017 | 11/1992 | Eddington et al. | 381/68.4 |
| 5,278,912 | 1/1994 | Waldhauser | 381/68.4 |

FOREIGN PATENT DOCUMENTS 59-051630  3/1984  Japan .

OTHER PUBLICATIONS

Clancy D A: "Highlighting Developments in Hearing Aids" Hearing Instruments vol. 46 No. 12, Dec. 1995, p. 18.

Primary Examiner—Huyen Le
Attorney, Agent, or Firm—Mark H. Jay

[57] ABSTRACT

A hearing aid has input AGC and output AGC using only one attack/release circuit and only one variable gain amplifier. An input AGC signal and an output AGC signal are summed and the summed signal, processed through the attack/release circuit, is used to control the gain of the variable gain amplifier.

7 Claims, 2 Drawing Sheets

HEARING AID HAVING INPUT AGC AND OUTPUT AGC

BACKGROUND OF THE INVENTION

The invention relates to hearing aids, and more particularly relates to hearing aids of the type having automatic gain control ("AGC"). In its most immediate sense, the invention relates to hearing aids having both input AGC and output AGC.

Hearing aids commonly have input AGC or output AGC, and at least one currently-available hearing aid having both. Input AGC is used for input compression, so that the response of the hearing aid circuit is properly matched to the patient's hearing impairment. Output AGC is used to prevent the patient from discomfort caused by abruptly loud noises, e.g. by the slam of a door. However, in the hearing aid that has input AGC and output AGC, the circuit is liable to function improperly. This is because this circuit uses two separate and independent AGC circuits. As a result, the circuit uses a relatively high number of components and can malfunction when the tolerances of those components add in the wrong way.

It would be advantageous to provide a hearing aid circuit, and a hearing aid, which would provide a patient with the advantages of both input AGC and output AGC while being simpler and less sensitive to tolerance variations of component values.

One object of the invention is to provide a hearing aid circuit, and a hearing aid, having both input AGC and output AGC while using a relatively simpler circuit.

Another object is, in general, to improve on known hearing aids and hearing aid circuits.

In accordance with the invention, AGC is carried out using a single variable-gain amplifier. This variable-gain amplifier is controlled in response to two signals; one derived from the input (microphone) side of the hearing aid circuit and the other derived from the output (receiver) side. Advantageously, and in accordance with the preferred embodiment, the signals are combined and routed through a single attack/release circuit. As a result, the circuit is greatly simplified and becomes less sensitive to tolerance variations of component values.

BRIEF DESCRIPTION OF THE DRAWINGS

The invention will be better understood with reference to the accompanying exemplary and non-limiting drawings, in which.

DETAILED DESCRIPTION OF PREFERRED EMBODIMENTS

Figure 1:
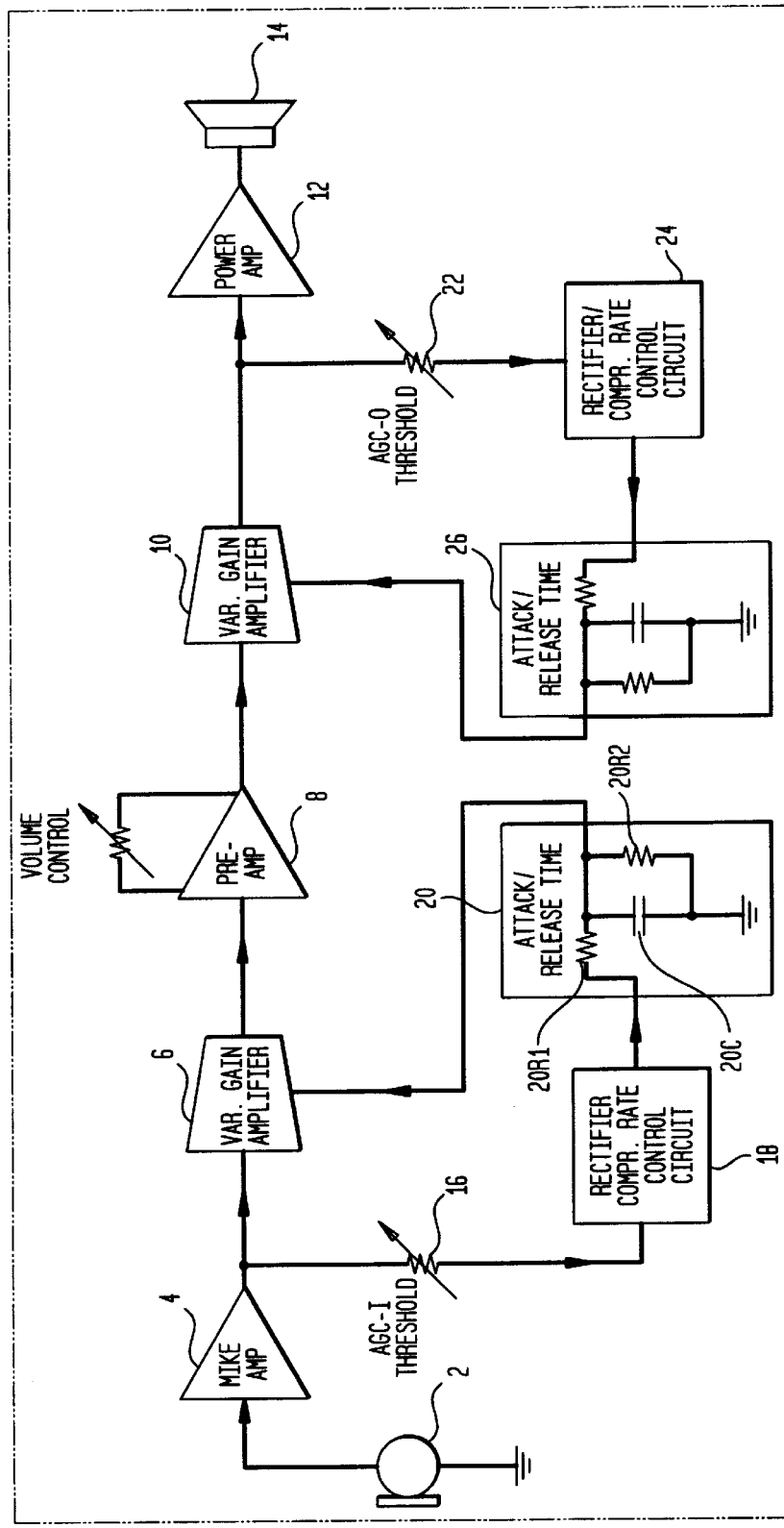
FIG. 1 illustrates a known hearing aid having both input AGC and output AGC.

The same element is always indicated by the same reference number in all the figures, and the correspondence between corresponding elements is indicated using primed reference numbers.

In a known hearing aid presently being sold by Starkey Laboratories, Inc., a microphone 2 is connected to the input of a microphone amplifier 4. The output of the microphone amplifier 4 is connected to the input of a variable gain amplifier 6, and the output of the variable gain amplifier 6 is connected to the input of a preamplifier 8. The output of the preamplifier 8 is connected to the input of a variable gain amplifier 10, and the output of the variable gain amplifier 10 is connected to the input of a power amplifier 12. The output of the power amplifier 12 is connected to a receiver 14.

An input AGC network is formed by using the signal at the input of the variable gain amplifier 6 to control the gain of the variable amplifier 6. A variable resistor 16 connects the input of the variable gain amplifier 6 to a control circuit 18, which in turn is connected to an attack/release circuit 20. The attack/release circuit 20 is in turn connected to the gain control input of the variable gain amplifier 6.

The functioning of this input AGC network will :now be explained. An input AGC network is used to match this characteristics of a hearing aid to the patient's impairment; the input AGC compresses the response of the system so the wide range of sound amplitudes presented to the microphone 2 is mapped to the narrow range of amplitude that the patient's ear can accommodate. The threshold of the input AGC network is adjusted by varying the resistor 16, and the actual compression is determined by selecting the characteristics of the control circuit 18. Conventionally, the control circuit 18 contains a rectifier and a nonlinear amplifier (both not shown), but this is not required; a person skilled in the art can easily provide appropriate circuitry for the control circuit 18 once the nature of the patient's hearing impairment is known. The function of the attack/release circuit 20 is to smooth the signal that is used to vary the gain of the variable gain amplifier 6.

This smoothing function is carried out by providing a capacitor 20C in the attack/release circuit 20, and making the gain of the variable gain amplifier 6 a function of the voltage across the capacitor 20C. More specifically, as the voltage across the capacitor 20C increases, the gain of the variable gain amplifier 6 decreases. The resistor 20R1 is connected in series between the control circuit 18 and the capacitor 20C. The rate at which the capacitor 20C charges (the so-called "attack time" of the attack/release circuit 20) is therefore determined by the RC time constant of the resistor 20R1 and the capacitor 20C.

A resistor 20R2 is placed across the capacitor 20C. This creates a discharge path by which the capacitor 20C may discharge through the resistor 20R2. The rate at which the capacitor 20C discharges (the so-called "release time") is therefore determined by the RC time constant of the resistor 20R2.

Let it be assumed that the amplitude of sound at the microphone 2 abruptly increases and that this increase causes an increased signal at the output of the control circuit 18. This abruptly increased amplitude will not immediately reduce the gain of the variable gain amplifier 6 because the voltage across the capacitor 20C will increase at a slower rate (the attack time of the attack/release circuit 20 is relatively slow). Rather, the gain of the variable gain amplifier 6 will reduce slowly, as the charge across the capacitor 20C continues to increase. Furthermore, let it be assumed that the amplitude of sound at the microphone 2 abruptly decreases, causing a decreased signal at the output of the control circuit 18. This abruptly decreased amplitude will not immediately raise the gain of the variable gain amplifier 6. This is because the voltage across the capacitor 20C will drop more slowly, this rate of change being determined by the rate at which the capacitor 20C discharges through the resistor 20R2, i.e. by the release time of the attack/release circuit 20, which release time is also relatively slow). In short, the attack/release circuit 20 smooths out sharp, short-term variations in the AGC control voltage; these variations, if not smoothed out, would produce drastic gain variations in the variable gain amplifier 6, which variations would be uncomfortable for the patient.

A similar AGC network—hereinafter referred to as an output AGC network—is used to control the gain of the variable gain amplifier 10. The purpose of the output AGC network is to protect the patient from the intense discomfort that abruptly intense sounds can produce. For example, if a patient is engaged in a quiet conversation and a door is slammed shut, the suddenly increased sound level can damage the patient's remaining hearing. To prevent this, the gain of the variable gain amplifier is rapidly reduced (short attack time) when the sound level increases rapidly. In the absence of more such high sound levels, the gain is then slowly increased (long release time). The threshold of the output AGC network is adjusted by varying the resistor 22, and the actual gain control scheme is determined by selecting the characteristics of the control circuit 24. Conventionally, the control circuit 24 contains a rectifier and a nonlinear amplifier (both not shown), but this is not required; a person skilled in the art can easily provide appropriate circuitry for the control circuit 24. The attack/release circuit 26 works the same was as does the attack/release circuit 20, but with different attack and release times to suit the application intended.

The circuit illustrated in FIG. 1 has two major disadvantages. First, it is relatively expensive because of the number of parts required. Second, if the resistors and capacitors in the control circuits 20 and 24 do not have values in proper relationship to each other (and this can happen if the tolerances of these values add in the wrong way), the circuit can malfunction.

Figure 2:
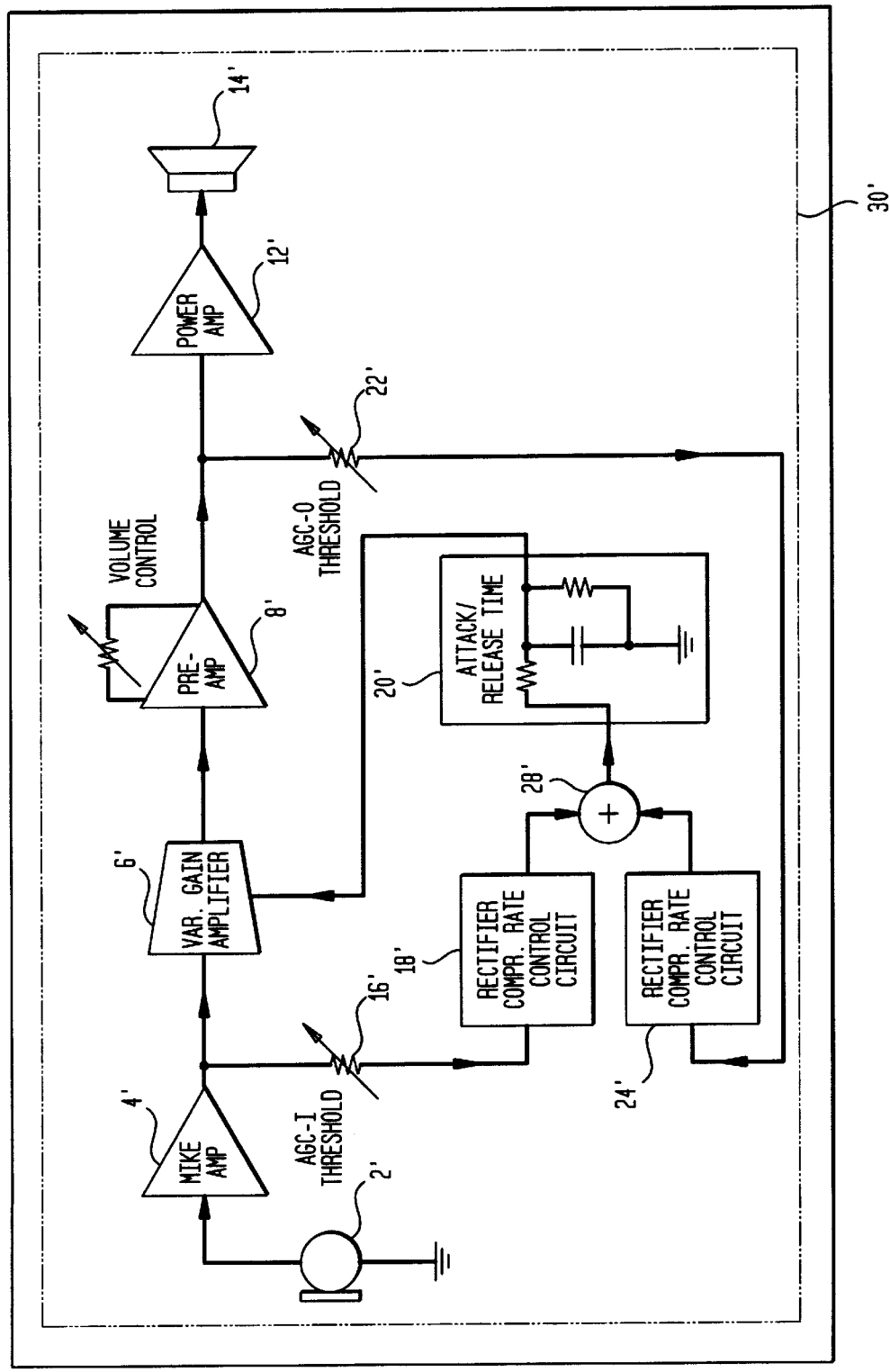
FIG. 2 illustrates a preferred embodiment of the invention.

Turning now to FIG. 2, the illustrated preferred embodiment of the invention has a microphone 2', a microphone amplifier 4', a variable gain amplifier 6', a preamplifier 8', a power amplifier 12' and a receiver 14'. These elements are identical to their counterparts in the FIG. 1 circuit, and are connected to operate in the same way. Furthermore, the output of an attack/release circuit 20' is connected to the gain control input of the variable gain amplifier 6'.

One end of a variable resistor 16' is connected to the input of the variable gain amplifier 6', and the other end of the variable resistor 16' is connected to the input of a control circuit 18'. (The control circuit 18' operates identically to the control circuit 18.) One end of a variable resistor 22' is connected to the input of the power amplifier 12', and the other end of the variable resistor 22' is connected to the input of a control circuit 24'. (The control circuit 24' operates identically to the control circuit 24.)

Signals at the outputs of the control circuits 18' and 24' are summed in a summer 28, which sums them together and produces a summed AGC signal. The summed AGC signal is then input to the attack/release circuit 20'.

The preferred embodiment of the invention illustrated in FIG. 2 includes input AGC and output AGC, but the AGC is accomplished in a manner different from that in FIG. 1. The threshold of the input AGC is established by the value of he variable resistor 16', and the threshold of the output AGC is established by the value of the variable 22'. Then, the input and output AGC signals produced respectively by the control circuit 18' and the control circuit 24' are summed together to form a summed AGC signal, which after processing in the attack/release circuit 20' is used to vary the gain of the variable gain amplifier 6'.

It may therefore be seen that in accordance with the preferred embodiment of the invention, input and output AGC are implemented using only one variable gain amplifier and only one attack/release circuit. This reduces cost and complexity and avoids malfunctions arising from mismatches between the components in two attack/release circuits.

In accordance with the preferred embodiment of the invention, the circuit illustrated in FIG. 2 is contained in a housing schematically illustrated by reference number 30.

While one or more preferred embodiments have been described above, the scope of the invention is limited only by the following claims:

What is claimed is:

1. A hearing aid circuit adapted for connection to a microphone and a receiver, comprising:

a variable gain amplifier having an input, an output and a gain control input, the gain of the variable gain amplifier being determined by an electrical signal present at the gain control input, and the variable gain amplifier being so connected that electrical signals at its input are determined by electrical signals from the microphone;

a power amplifier having an input and an output, the output being adapted for connection to the receiver, and the power amplifier being so connected that signals at its input are determined by signals at the output of the variable gain amplifier;

an input network responding to electrical signals at the input of the variable gain amplifier and producing an input AGC signal;

an output network responding to electrical signals at the input of the power amplifier and producing an output AGC signal;

a summing circuit connected to the input and output networks and producing a summed AGC signal; and an attack/release circuit connected between the summing circuit and the gain control input, the attack/release circuit responding to the summed AGC signal and producing an electrical signal at the gain control input.

2. The circuit of claim 1, further comprising a preamplifier connected between the output of the variable gain amplifier and the input of the power amplifier.

3. The circuit of claim 1, further comprising a microphone amplifier having an input adapted for connection to a microphone and an output connected to the input of the variable gain amplifier.

4. The circuit of claim 1, wherein the attack/release circuit comprises a capacitor, wherein the summed AGC signal is used to charge the capacitor, and wherein the signal at the gain control input reflects the charge across the capacitor.

5. The circuit of claim 4, wherein the attack/release circuit further comprises a charging resistor and a discharging resistor, the charging resistor being in series with the capacitor and the discharging resistor being in parallel with the capacitor.

6. A hearing aid having input and output automatic gain control (AGC), comprising:

a microphone;

a variable gain amplifier having an input, an output and a gain control input, the gain of the variable gain amplifier being determined by an electrical signal present at the gain control input, and the variable gain amplifier being so connected that electrical signals at its input are determined by electrical signals from the microphone;

a receiver;

a power amplifier having an output and an input, the output being connected to the receiver, and the power amplifier being so connected that signals at its input are determined by signals at the output of the variable gain amplifier;

an input network responding to electrical signals at the input of the variable gain amplifier and producing an input AGC signal;

an output network responding to electrical signals at the input of the power amplifier and producing an output AGC signal;

a summing circuit connected to the input and output networks and producing a summed AGC signal;

an attack/release circuit connected between the summing circuit and the gain control input, the attack/release circuit responding to the summed AGC signal and producing an electrical signal at the gain control input; and a housing containing the microphone, the receiver, the circuits and the networks.

7. A hearing aid circuit having a variable gain amplifier, input automatic gain control (AGC), and output automatic gain control (AGC), comprising:

means for deriving an input AGC signal;

means for deriving an output AGC signal;

means for summing the input AGC signal and the output AGC signal and thereby producing a summed AGC signal;

means for smoothing the summed AGC signal and thereby producing a smoothed AGC signal; and means for adjusting the gain of the variable gain amplifier in accordance with the smoothed AGC signal.

* * * * *